United States Patent [19]

Labes et al.

[11] Patent Number: 4,966,817
[45] Date of Patent: Oct. 30, 1990

[54] TRANSITION-METAL-CARBON COMPOSITES AND METHODS FOR MAKING

[75] Inventors: Mortimer M. Labes, Philadelphia, Pa.; J. H. Chen, Rochester, N.Y.

[73] Assignee: Temple University, Philadelphia, Pa.

[21] Appl. No.: 99,827

[22] Filed: Sep. 23, 1987

[51] Int. Cl.$^5$ .......................... B22F 3/00; C01B 21/06
[52] U.S. Cl. .................................. 428/552; 428/113; 428/408; 427/62; 427/113; 423/364
[58] Field of Search ................... 428/552, 408, 113; 427/62; 423/364; 427/113

[56] References Cited

U.S. PATENT DOCUMENTS

| | | | |
|---|---|---|---|
| 4,299,861 | 11/1981 | Dietrich et al. | 427/62 |
| 4,341,924 | 7/1982 | Gleim | 427/62 X |
| 4,548,957 | 10/1985 | Hucke | 428/408 X |
| 4,581,289 | 4/1986 | Dietrich et al. | 427/62 X |
| 4,582,751 | 4/1986 | Vasilos et al. | 428/408 X |
| 4,585,696 | 4/1986 | Dustmann et al. | 427/62 X |
| 4,649,038 | 3/1987 | Labes et al. | 204/63 X |
| 4,657,776 | 4/1987 | Dietrich et al. | 427/62 X |
| 4,737,540 | 4/1988 | Yoshida et al. | 428/408 X |
| 4,772,502 | 9/1988 | Okura et al. | 428/408 X |

Primary Examiner—Peter A. Nelson
Attorney, Agent, or Firm—Ratner & Prestia

[57] ABSTRACT

Carbon-transition metal composite formed via pyrolytic decomposition of a polycyanogen in the presence of a transition metal or a salt thereof.

42 Claims, 5 Drawing Sheets

SCANNING ELECTRONIC MICROGRAPH OF CARBON-TaC COMPOSITE
FIBER CONTAINING 2.5% TaC

TRANSITION-METAL-CARBON COMPOSITES AND METHODS FOR MAKING

FIELD OF THE INVENTION

This invention, was made in the course of work under National Science Foundation Grant Number DMR 83-20329, and DMR 87-03526, and is subject to governmental rights based thereon, except to the extent such rights have been waived.

This invention pertains to methods for making carbon-transition metal composite fibers, films and powders, and graphitized-transition metal composite fibers, films and powders, via pyrolytic decomposition of a transition metal-polymer complex and to the products of the methods. Preferred forms of the invention include carbon-transition metal composite fibers which are superconductive.

BACKGROUND OF THE INVENTION

Carbon fibers are produced from a wide variety of precursors, the most common being polyacrylonitrile, pitch, pitch mesophase and benzene decomposition. These are discussed generally in J. D. Donnet and R. C. Bansal, "Carbon Fibers", Marcel Dekker, New York, 1984. The production of such fibers requires treating the fiber precursor to elevated temperatures in excess of 2000° C. In the heat treating process of such polymer fibers, it is well known that partially or fully graphitized structures may be developed, but the degree of disorder, the orientation of the basal plane, and the extent of impurity depend on a combination of the heat treatment temperature, tension of the fiber during the heating process, and the structure of the precursor. Frequently, heat treatment in such processes is conducted at temperatures as high as 3200° C. before well-developed graphitic structures are encountered and conductivity approaches that of a single crystal graphite.

It is recognized that carbon fibers have very desirable thermal and mechanical stability, and can be fabricated into continuous filaments and/or films. Further, it is also recognized that such properties are desirable in a superconductor. To this end, carbon fibers coated by chemical vapor deposition with niobium carbonitride (NbCN) films are known and have been studied extensively because the fiber substrate allows processing while the NbCN has desirable superconducting properties.

U.S. Pat. No. 4,585,696, U.S. Pat. No. 4,299,861, U.S. Pat. No. 4,657,776, and U.S. Pat. No. 4,581,289 disclose superconducting fibers consisting of carbon fiber bases each covered with a transition metal carbide superconducting layer.

In the '696 patent, this layer may consist of niobium carbonitride or a niobium oxycarbonitride. The niobium is simultaneously deposited through chemical vapor deposition and carbonitrided in a carbon and nitrogen containing atmosphere. This superconducting layer is then covered with a layer of high purity copper or aluminum.

Similarly, the superconducting layer in the 861 patent also consists of a niobium carbonitride layer. The layer is formed by first coating the carbon fiber with niobium by chemical vapor deposition and then heating it in a carbon and nitrogen atmosphere. The '776 and '289 patents relate to processes for chemical vapor deposition of niobium carbonitride on a carbon fiber carrier. This superconducting layer is then covered with high purity copper.

U.S. Pat. No. 4,649,038 of common inventorship and assignment herewith, pertains to a conductive polymer prepared from a novel polycyanogen, to fibers made therefrom, and to the method of preparation of these polymers and fibers.

BRIEF DESCRIPTION OF THE INVENTION

The present invention comprises a carbon-transition metal composite formed via the pyrolytic decomposition of a transition metal-polycyanogen complex, fibers, films and powders thereof and methods of making these composites. The carbon in these composites may be partially or fully graphitized and the transition metal may be in the form of a carbide in the pyrolyzed product.

The precursor from which the composite of the present invention is formed is a polymer, namely a polycyanogen (sometimes referred to herein as "PCN") of the type described in U.S. Pat. No. 4,649,038, comprised of

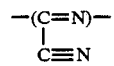

units and having a molecular weight of at least 500 and characteristic IR absorption peaks at 2220–2240 $cm^{-1}$ and 1500–1600 $cm^{-1}$, and 13[C] NMR peaks at 112–117 and 157–161 PPM. However, in the present invention the polymer is modified to include, dispersed uniformly therethrough, transition metal ions which form complexes with polycyanogen. As used herein, transition metals include not only those elements of the periodic table commonly referred to as transition metals, but al so the elements in family 3A, 4A and 5A which share characteristics with transition metals in that they form complexes with PCN. Transition metals used herein therefore would include aluminum (element 13), elements 21 through 33, elements 39 through 51 and elements 57 through 83. Preferred transition metals in this invention are those known to have superconducting properties such as tantalum, niobium or titanium. However, other transition metals which have normal electroconductive properties or which have magnetic properties may also be used in accordance with the present invention.

The polycyanogen polymer precursors of the present invention may be dissolved in a solution from which fibers, films or powders may be fabricated The present invention consists, inter alia, of adding to these solutions soluble salts of transition metals (forming "precursor solutions") and, subsequently forming, via thermolytic decomposition, pyropolymers of the transition metal-containing polycyanogen. Another method by which fibers, films and powders of the present invention may be prepared is by heating preformed PCN articles in the presence of a transition metal (and preferably in contact with a transition metal foil or powder) in an evacuated atmosphere for a predetermined length of time. The transition metal-pyropolymer has a carbon-nitrogen ratio of 1.2, or greater preferably at least 5, a room temperature conductivity on the order of 3000 $ohm^{-1}cm^{-1}$, and an activation energy for conduction of less than 0.04 eV (preferably less than 0.005 eV). The present invention also includes methods of making this transition metal-polycyanogen complex and methods for making fibers, films and powders, and pyropolymers derived therefrom.

The fiber product as drawn from a solution of the transition metal containing polycyanogen has good tensile strength. In pyrolyzed form, the fiber product when made with tantalum or niobium salts is electrically superconductive at temperatures of the order of 1°–10° K.

DETAILED DESCRIPTION OF THE INVENTION

Figure 1:
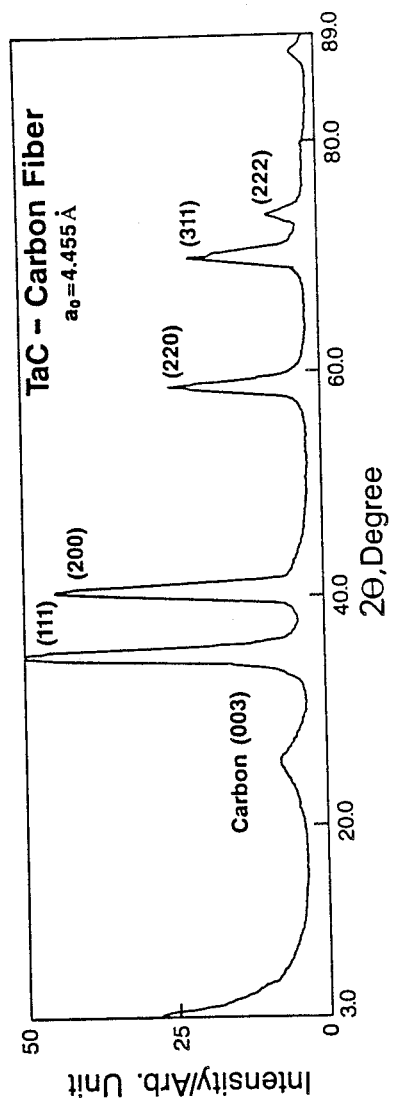
FIG. 1 is an x-ray powder diffraction diagram of a carbon-TaC composite fiber containing 10% tantalum.

The method of forming the polycyanogen precursor as disclosed by U.S. Pat. No. 4,649,038 is incorporated by reference herein. Briefly, according to one synthetic process of that invention, $C_2N_2$ (cyanogen or ethanedinitrile, 1–1.5 moles/l) in an electrolyte solution comprising, in addition to $C_2N_2$, acetonitrile or any other appropriate polar organic solvent, and any appropriately soluble and stable electrolyte, such as tetraethylammonium tetrafluoborate ($Et_4NBF_4$) and tetramethylammonium tetrafluoborate ($Me_4NBF_4$) (electrolyte concentration of about 0.1 mole/l), is placed in an electrolytic cell containing two glassy carbon electrodes. Polymerization is initiated electrochemically, typically at a voltage of approximately 5–15 V with a current of 85 mA–0.3 mA. During reaction, a black polymer deposit is formed on the anode and in the cell surrounding the anode.

This polymer deposit is recovered and purified by precipitation from tetrahydrofuran or dimethylformamide with petroleum ether, to increase the average molecular weight of the polymer, as purified, to above 500.

According to one method of the present invention, in order to draw the polymeric composition of this invention into a fiber, the polymer is first prepared according to the above process and subsequently dissolved in tetrahydrofuran or dimethylformamide or a mixture of THF and MF containing a soluble salt of a transition metal such as tantalum chloride ($TaCl_5$), niobium chloride ($NbCl_5$), ferrous chloride ($FeCl_2$), manganese chloride ($MnCl_2$), aluminum chloride ($AlCl_3$), copper chloride ($CuCl_2$) and cuprous acetate ($CuCOOCH_3$) to cite a few examples.

After dissolving the polymer in the appropriate solvent (containing the transition metal salt), the solution is concentrated to a viscous state by solvent evaporation and then drawn into fibers, typically 3–5 inches long with some as much as 2 feet long. These fibers have diameters on the order of 10 microns to 50 microns and good uniformity.

Fibers prepared in accordance with the present invention are drawn by pulling from the solution with a pipette or rod in an inert atmosphere. These fibers are optically uniaxial indicating orientation of the polymeric rods along the direction of the fiber. The electron microscopy of such fibers indicates that they are relatively dense and hole-free. Upon heating in a vacuum to temperatures on the order of 1800° C. for two or three days, the polymeric fiber product retains its fiber form and becomes hard, shiny, flexible and strong. Optically, this pyrolyzed product appears amorphous and highly reflective, with a high conductivity, typical of commercial carbon fibers produced by other routes but usually at higher temperatures.

This simple fiber forming procedure can obviously be improved by utilizing commercial "spinning" equipment in which fibers are formed by extruding or forcing a solution through a "spinneret" at controlled rates into the air or an inert atmosphere or a quenching solution All such drawing and extruding processes are referred to collectively herein as "spinning". The pyrolysis techniques discussed herein may also be improved by placing the formed fibers under tension as is done with current fiber processing techniques.

The method of the present invention involving the preparation of transition metal-polymer complexes or polycyanogen in solution, the solvent of choice may be substantially any solvent non-reactive with and capable of solubilizing the solutes, i.e., polycyanogen, with or without the transition metal salt. Typically, this will be a polar solvent such as tetrahydrofuran, dimethylformamide or mixtures thereof which are also relatively easily separated from the solutes by fiber drawings or by evaporation as in film casting. Generally, it is the anion of the soluble salt which dictates solubility of the salt in such solvents. Suitable anions include nitrates, sulfates and halides, as well as organic anions such as acetate.

The ability of polycyanogen to form complexes with transition metals is due to the fact that polycyanogen has a large number of nitrile ligands as well as "lone pair" nitrogen atoms in the backbone of the polymer. These complexes are formed whether the transition metal is added to the polycyanogen solution or when heated in contact with the preformed fibers. However, not all carbon fiber precursors have the ability to form such complexes. Other carbon fiber precursors, such a polyacrylonitrile, which also contains nitrile groups, are not known to form such complexes with transition metals.

Suitable complex forming metals include Ti, Nb, W, Fe, Mn, Sn, Sb, As, Cu, Al and a variety of other metals in groups 3A, 4A, and 5A of the periodic table. For the complexes having superconducting properties, a representative list of preferred superconductive compounds and alloys may be found in Roberts, B. W., "Properties of Selected Superconductive Materials," 1978 Supplement NBS Technical Note 983, U.S. Government Printing Office. Among these, niobium and tantalum are most preferred.

The process and procedure of the present invention are simple and the processing temperature is low compared to conventional production of carbon fibers, as in known prior art processes. Therefore, the present process is considerably advantageous over such known processes. Furthermore, since the transition metal polymer complex can be shaped or formed, for example, as cast films by conventional solution casting methods from dimethylformamide solutions, the present invention is not limited to fibers. Still further, the transition-metal polymer complexes of the present invention may also be prepared as a powder or finely divided material by evaporating the precursor solutions to dryness in vacuuo.

Following are generalized examples of the synthetic methods of the present invention (in all cases the PCN precursors are prepared according to U.S. Pat. No. 4,649,038):

Typically, tantalum chloride or niobium chloride is dissolved in a concentration range of a few percent to 25% by weight of polymer in a concentrated solution of the PCN polymer (approximately 30-40% by weight) in dimethylformamide. The solution is simply stirred at room temperature for a short period of time, usually 2-3 hours. Fibers of these transition metal-polymer complexes are hand-drawn from the viscous solution with the tip of a glass rod.

These fibers are heated in an inert gas stream in stages to 700° C. After this initial heating they are transferred to a vacuum induction furnace and heated to 1800° C. to complete the graphitization process. The resulting product of this process are graphitic fibers showing room temperature conductivities on the order of 3000 S $cm^{-1}$.

After the transition metal-containing polymers are thermally decomposed, and heated to 1800° C., only a trace of chlorine (less than 0.1%) is found in the polymer. Aside from some residual nitrogen, on the order of 2-3%, the sample consists entirely of carbon and tantalum.

Carbon-transition metal fibers may also be prepared by heating a preformed PCN fiber in contact with the transition metal in foil or powder form.

For example, PCN fibers of approximately 50 microns cross-section have been prepared by drawing fibers from a solution of PCN in a mixture of dimethylformamide and tetrahydrofuran. These fibers were placed on a tantalum plate having a thickness of approximately 1/64th of an inch. The fibers were then cemented to the edges of the plate with a slight tension in the fiber using a ceramic paste. The cemented fibers were then placed on a vycor or quartz tube which was sealed in vacuuo and heated to 700° C. for 24 hours. The tube was then cooled, opened and the PCN fibers detached. By this contact method, tantalum reacted with PC to form the pyropolymer. The fibers were then heated in a vacuum induction furnace to 1800° C. The fibers listed in Table 1 having 30% tantalum by weight were prepared in this manner.

Similarly, carbon-transition metal composites may be prepared by heating PCN fibers in contact with a transition metal powder such as tantalum, while the fibers are held under tension. The fibers are then heated to 700° C., the tension released, and the fibers subsequently processed at higher temperatures as previously indicated to complete the carbonization and carbidization processes.

As another example, ferrous chloride may be dissolved in a concentration range of a few percent to 20% in a solution of 90% dimethylformamide/10% tetrahydrofuran and 30% PCN. The mixture is then stirred for approximately 4 hours. Hand drawn fibers may be prepared as described above in the previous example.

Powder samples of a PCN-Fe complex may also be prepared by evaporating the ferrous chloride and PCN solution to dryness in vacuuo, yielding a finely divided powdered material.

Similarly, films of the PCN-Fe complex may be prepared by pouring the viscous solution of ferrous chloride and PCN onto a glass plate, leveling the poured material by drawing a leveling bar over the viscous solution and allowing the solution to evaporate under an infrared lamp in an inert atmosphere box.

In each case, the fiber, powder or film sample is then heated in an inert gas stream in stages to 700° C. After this initial heating these samples are transferred to a vacuum induction furnace and heated to 1800° C. to complete carbonization and/or partial or complete graphitization The resulting products of these processes have iron particles dispersed uniformly throughout their matrices.

Additionally, fibers containing copper may also be prepared in accordance with the present invention. For example, a saturated solution of cuprous chloride in dimethylformamide may be prepared and may be added to an equal volume of a saturated solution of PCN in dimethylformamide. The mixture of the two solutions is then stirred for a short period of time, usually 2-3 hours. Fibers, powders and films may then be prepared from the resulting solutions as indicated above. As in previous generalized examples, these articles can be converted to partially or fully graphitized fibers, powders and films having variable copper content from 2-15%.

Another procedure of the present invention is to take a preformed carbon fiber made from any of the common commercial routes, such as the decomposition of polyacrylonitrile or from pitch mesophase decomposition. These fibers can then be coated with a layer of PCN-transition metal salt by spraying, dip-coating or passing a filament of the carbon fiber through a solution or solutions of PCN-transition metal salts in dimethylformamide tetrahydrofuran or mixtures thereof. Once a uniform coating is applied in any of these ways, the fibers can then be fired in vacuuo or in an inert gas stream, thus forming a coating of carbon-transition metal complex on the performed carbon fiber. Such a method of solution coating is economically advantageous as compared to the chemical vapor deposition methods previously described in the above cited prior art.

By way of further example, preformed carbon fibers made from the decomposition of polyacrylonitrile may be dipped into a solution containing 40% PCN in a mixture of 60% dimethylformamide/40% tetrahydrofuran, together with 10% tantalum chloride. The fibers are slowly drawn out of the solution and placed in a vacuum furnace. The final product comprises a carbon fiber derived from polyacrylonitrile having a outer skin of tantalum carbide in a layer of graphite restricted to the surface of the fiber.

The following table and the figures (diagrams, photograph and plots) show some of the physical properties of TaC-carbon fibers prepared in accordance with the present invention.

Data pertinent to the superconductive properties of several tantalum carbide - carbon fiber samples are presented in Table I.

TABLE I

Properties of TaC-C Composite Fibers as a Feunction of Tantalum Content

| Ta (% by wt) | $T_c$ (°K) | $\beta_{RT}$ (ohm cm × $10^4$) | Ea (eV) |
|---|---|---|---|
| 30* | 9.8-10 | 3.0 | −0.004 |

TABLE I-continued

Properties of TaC-C Composite Fibers as a Feunction of Tantalum Content

| Ta (% by wt) | $T_c$ ($^\circ K$) | $\beta_{RT}$ (ohm cm × 10⁴) | Ea (eV) |
|---|---|---|---|
| 22 | 5.5–5.8 | 9.6 | 0.004 |
| 6 | 3.8–4 | 4.0 | 0.0005 |
| 2.5 | 1.2–2 | 2.8 | 0.0001 |

$T_a$ = % tantalum by weight of pyropolymer
$T_c$ = Superconducting transition temperature degrees Kelvin
$\rho_{rt}$ = Electronic resistivity
Ea = Activation energy
*Sample prepared by heating polycyanogen fibers in contact with Ta for 24 hours at 700° C. prior to heating the fibers to 1800° C.

FIG. (an x-ray powder diffraction diagram, (K₂ stripped) for a fiber containing 10% tantalum by weight), shows a clear match to tantalum carbide as well as a graphite peak. Tantalum carbide is known to show a linear relationship between lattice parameters and composition, and one can therefore calculate the tantalum to carbon ratio from the diffraction data. Tantalum carbide forms a face-centered cubic lattice for which the lattice parameter $a_o$ decreases as the crystal becomes deficient in carbon. For the composite fiber having tantalum content of 10%, the tantalum:carbon ratio was 1±0.04. This ratio is also present in composite fibers having tantalum contents of 22.1, 6 0 and 2.5% (data not shown).

Figure 2:
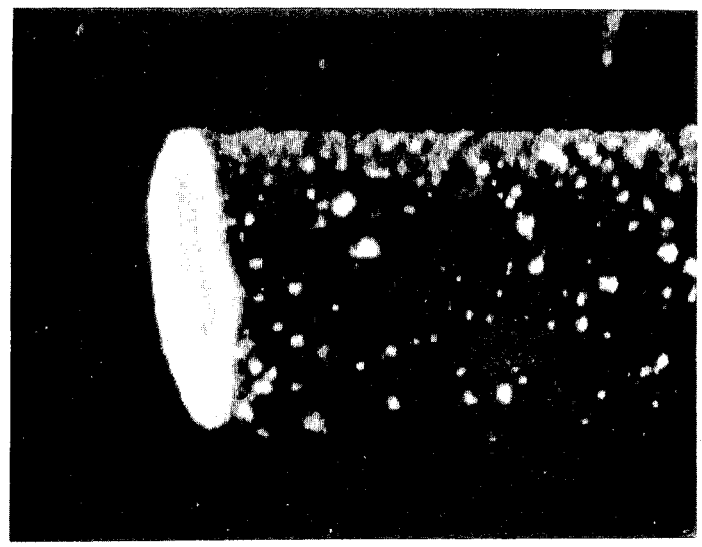
FIG. 2 is a scanning electron micrograph of a carbon-TaC composite fiber containing 2.5% tantalum.

Scanning electronic microscopic investigation indicates that the pyrolyzed fibers of this invention are uniform and dense. In FIG. 2 is shown such a photograph in which back-scattering is used to facilitate distinguishing between heavy tantalum carbide and light carbon domains. The heavy tantalum carbide areas are lighter in contrast than are the darker carbon domains.

Figure 3:
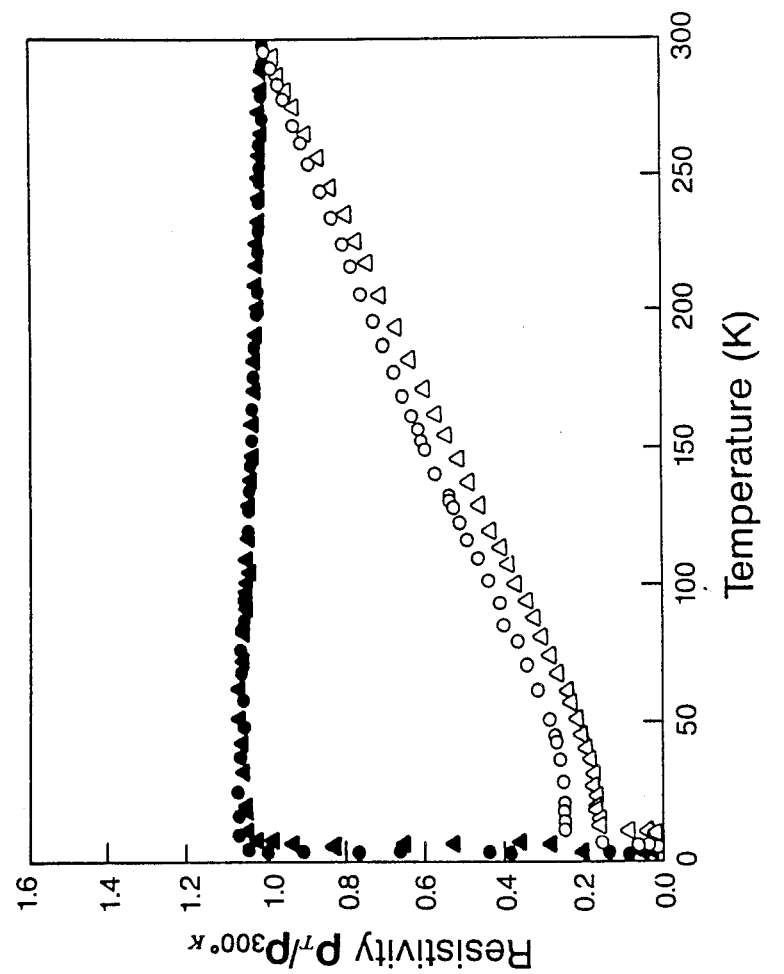
FIG. 3 is a plot of the resistance ratio of carbon-TaC composite fibers from 300° K though the superconducting transition corresponding to some of the samples listed in Table I.

The normal state resistivity is plotted in FIG. 3. The four samples contain tantalum in accordance with the weight percentages shown in Table I (▲=6%, ●=2.5%, △=30%, and O=30%). From the data in FIG. 3, it will be observed that for tantalum-containing superconducting fibers, the superconductive transition temperature increases with tantalum content.

Figure 4:
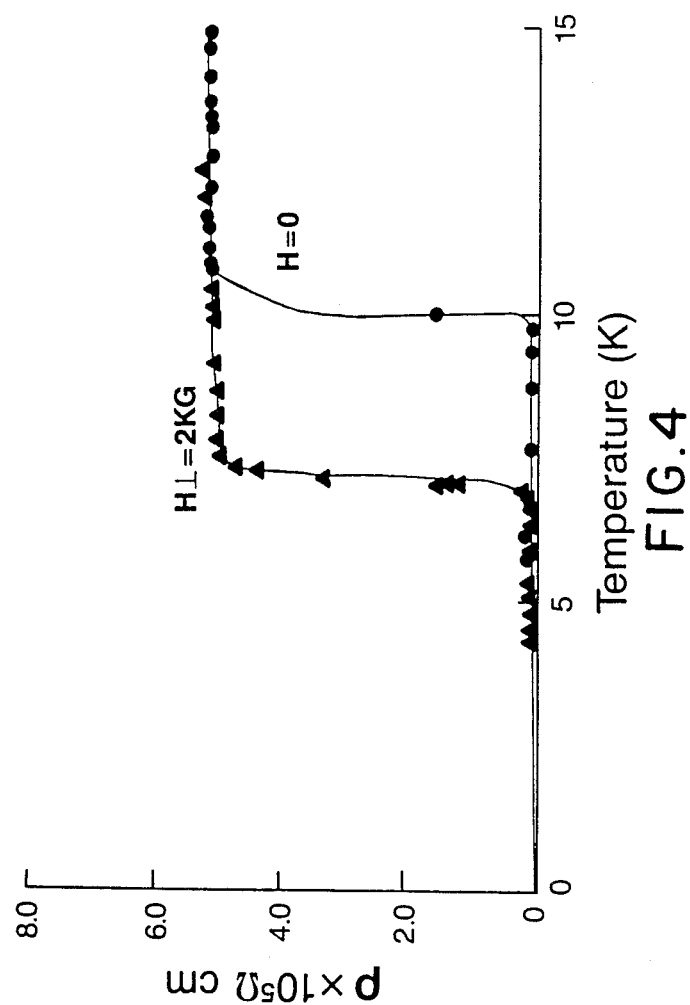
FIG. 4 is a plot of the resistivity of two samples of carbon-TaC composite fibers in the superconducting region with and without application of a 2 KG magnetic field perpendicular to the fiber axis.

FIG. 4 is a plot of resistivity vs. temperature for a tantalum fiber containing 30% by weight tantalum, through the superconducting transition range, with and without application of a magnetic field of 2.0 KG normal to the fiber axis. These samples were prepared by heating polycyanogen fibers in contact with tantalum. One of the two samples (identified "▲") by was tilted slightly with respect to the normal axis, and the critical field shows a dependence on orientation, indicating the anistropic character of the samples. The residual resistivity is approximately $10^{-10}$ cm and the width of the transition is approximately 0.4 K. From the data in FIG. 4, it is observed that the application of the magnetic field suppresses the superconductivity transition temperature, indicating that the fiber possesses characteristics typical of a superconductor.

Figure 5:
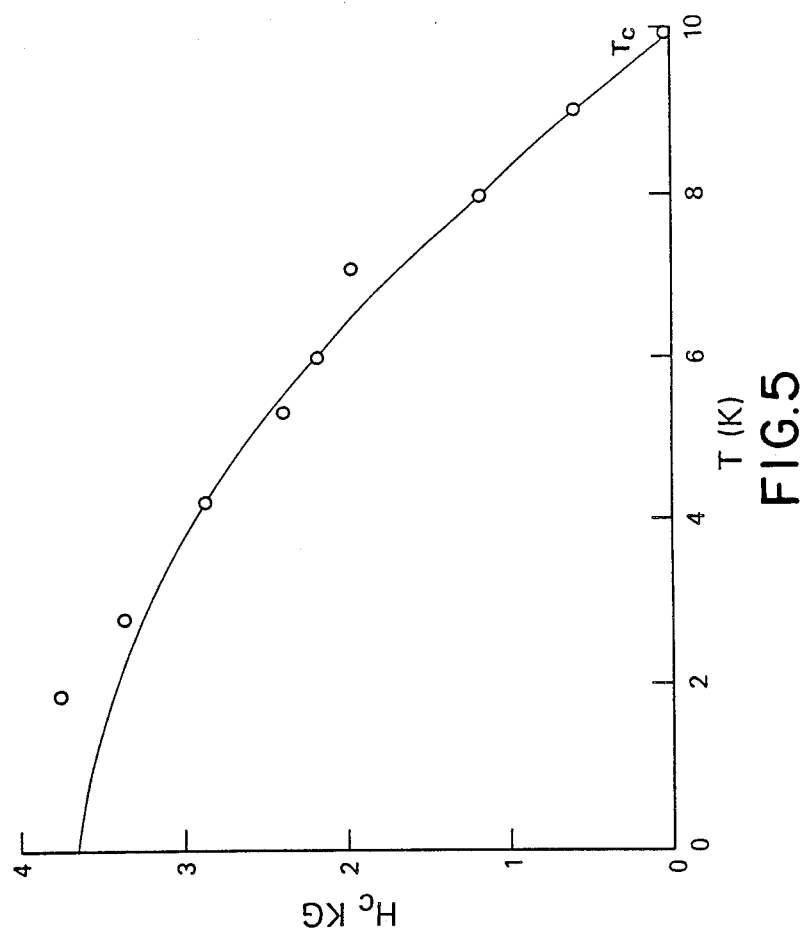
FIG. 5 is a plot showing the critical magnetic field required to restore carbon-TaC composite fibers to the normal state from the superconducting state, as a function of temperature.

FIG. 5 is a plot of the critical magnetic field required to restore a fiber containing 30% by weight tantalum to its metallic state below $T_c$ as a function of temperature. $H_o$, the critical field at 0° K is 3.7±0.2 KG as calculated from the relation:

$$H_C = H_o[1 - (T_o/T_c)^2]$$

An indication of the degree of graphitic disorder in fibers prepared in accordance with the present invention can be obtained from their Raman spectra as tauqht by K. Matsumura, A. Takahashi and J. Tsukamoto, Synth Met Vol. 11, pg. 9, (1985). Two peaks are usually seen in carbon fibers at 1360 and 1585 cm⁻¹. These are associated with ordered and disordered graphitic structures respectively. Polycyanogen-1800 fibers which have been heated under tension to 700° C. and then heated to 1800° C. show a considerable decrease in the disorder peak as compared to samples heated to 1800° C. without any tension being applied, but it is clear that the samples are still not completely ordered. Further ordering can be accomplished by heating to even higher temperature up to 3000° or 3200° C., as is known for conventional carbon fibers.

While this invention has been described with respect to specific embodiments thereof, it is not limited thereto. The appended claims therefore are intended to be construed to encompass not only those forms of the invention disclosed herein but to such other forms and variants as may be made by those skilled in the art without departing from the true spirit and scope of the invention.

We claim:

1. Method for making a carbon-transition metal composite comprising heating polycyanogen in the presence of a transition metal or transition metal salt in an oxygen-free environment to at least 400° C. and holding it at that temperature for a time sufficient to form a pyropolymer having a carbon to nitrogen ratio of at least 1.2 and to form a composite containing pyrolyzed polycyanogen and a transition metal.

2. The method of claim 1 wherein the method comprises:
   preparing a solution of a polycyanogen and at least one transition metal salt in a solvent;
   removing said solvent therefrom to form a polycyanogen-transition metal salt intermediate product;
   and heating said intermediate product in an oxygen-free environment to at least 400° C. and holding it at that temperature for a time sufficient to form a pyropolymer having a carbon to nitrogen ratio of at least 1.2 and to form a composite containing pyrolyzed polycyanogen and a transition metal.

3. The method of claim 1 wherein the method comprises:
   preparing a solution of a polycyanogen in a solvent;
   removing said solvent therefrom to form a polycyanogen intermediate product;
   and placing said intermediate product in contact with a transition metal, powder or foil and heating said article slowly in an oxygen-free environment to at least 400° C. and holding it at that temperature for a time sufficient to form a pyropolymer having a carbon to nitrogen ratio of at least 1.2 to form a graphite-transition metal carbide composite containing pyrolyzed polycyanogen and a transition metal.

4. The method of claim 2 or 3 wherein said intermediate product is a fiber.

5. The method of claim 2 or 3 wherein said intermediate product is a film.

6. The method of claim 2 or 3 wherein said intermediate product is a powder.

7. The method of claim 2 or 3 wherein said intermediate product is a coating on a carbon substrate.

8. The method of claim 7 wherein said carbon substrate is a graphite-transition metal carbide composite comprising the pyrolized product of a mixture of a polycyanogen and a transition metal, said product having a carbon to nitrogen ratio of at least 9. The method of claim 1 wherein said transition metal is selected from the group consisting of niobium, tantalum, copper, tin, tungsten, silver, manganese, iron, arsenic, aluminum and antimony.

10. The method of claim 2 or 3 wherein said transition metal forms a carbide which is a superconductor.

11. The method of claim 10 wherein said transition metal is selected from the group consisting of niobium or tantalum.

12. The method of claim 2 wherein said solvent is selected from the group consisting of dimethylformamide, tetrahydrofuran, and a mixture thereof.

13. The method of claim 2 wherein the anion of said transition metal salt is selected from the group consisting of nitrates, sulfates, halides and organic anions.

14. The method of claim 13 wherein the anion of said transition metal salt is selected from the group consisting of acetate and chloride.

15. A product comprising polycyanogen and a transition metal salt in a non-reactive solvent.

16. A solid comprising a polycyanogen-transition metal complex.

17. A solid, as recited in claim 16, in the shape of a fiber.

18. A solid, as recited in claim 16, in the shape of a film.

19. A solid, as recited in claim 16, in the shape of a powder.

20. A solid, as recited in claim 16, in the shape of a coating on a carbon substrate.

21. A carbon-transition metal composite comprising the pyrolized product of polycyanogen and a transition metal, said product having a carbon to nitrogen ratio of at least 1.2.

22. A carbon-transition metal composite as set forth in claim 21 wherein said transition metal is selected from the group consisting of niobium, tantalum, copper, tin, tungsten, silver, manganese, iron, arsenic, aluminum and antimony.

23. A carbon-transition metal composite as set forth in claim 21 wherein said composite is a superconductor.

24. A carbon-transition metal composite as set forth in claim 23 wherein the transition metal is selected from the group consisting of niobium and tantalum.

25. A carbon-transition metal composite as set forth in claim 24 wherein said composite is shaped as a fiber.

26. A carbon-transition metal composite as set forth in claim 24 wherein said composite is shaped as a film.

27. A carbon-transition metal composite as set forth in claim 21 wherein said carbon is partially or fully graphitized.

28. A carbon-transition metal composite as set forth in claim 24 wherein said composite is a coating on a carbon substrate.

29. The article made by the method of claim 1.
30. The article made by the method of claim 2.
31. The article made by the method of claim 3.
32. The article made by the method of claim 4.
33. The article made by the method of claim 10.
34. The article made by the method of claim 11.

35. A method, as recited in claim 1, wherein said heating time and temperature is sufficient to partially or fully convert said carbon to a graphitic structure.

36. The article made by the method of claim 35.

37. The method of claim 1 wherein said polycyanogen and transition metal salt are heated to at least 700° C.

38. The method of claim 1 wherein said polycyanogen and transition metal salt are heated to at least 1800° C.

39. The method of claim 37 or 38 wherein said transition metal is selected from the group consisting of niobium, tantalum, copper, tin tungsten, silver, manganese, iron, arsenic, aluminum, and antimony.

40. The article made by the method of claim 37.
41. The article made by the method of claim 38.
42. The article made by the method of claim 39.

* * * * *

UNITED STATES PATENT AND TRADEMARK OFFICE
CERTIFICATE OF CORRECTION

PATENT NO. : 4,966,817

DATED : October 30, 1990

INVENTOR(S) : Mortimer M. Labes, J. H. Chen

It is certified that error appears in the above-identified patent and that said Letters Patent is hereby corrected as shown below:

Column 6, line 64, change "Feunction" to --Function--.

Column 6, line 66, change "$P_{RT}$" to --$P_{rt}$--.

Column 7, line 2, change "Feunction" to --Function--.

Column 7, line 4, change "$P_{RT}$" to --$P_{rt}$--.

Signed and Sealed this

Nineteenth Day of May, 1992

Attest:

DOUGLAS B. COMER

*Attesting Officer*  *Acting Commissioner of Patents and Trademarks*